United States Patent
Kumar et al.

(10) Patent No.: US 9,130,057 B1
(45) Date of Patent: Sep. 8, 2015

(54) HYBRID DICING PROCESS USING A BLADE AND LASER

(71) Applicants: Prabhat Kumar, Fremont, CA (US); Wei-Sheng Lei, San Jose, CA (US); James Papanu, San Rafael, CA (US); Brad Eaton, Menlo Park, CA (US); Ajay Kumar, Cupertino, CA (US)

(72) Inventors: Prabhat Kumar, Fremont, CA (US); Wei-Sheng Lei, San Jose, CA (US); James Papanu, San Rafael, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/320,405

(22) Filed: Jun. 30, 2014

(51) Int. Cl.
| H01L 21/822 | (2006.01) |
| H01L 21/67 | (2006.01) |
| B23K 26/00 | (2014.01) |
| B26D 9/00 | (2006.01) |

(52) U.S. Cl.
CPC .......... *H01L 21/822* (2013.01); *B23K 26/0057* (2013.01); *B26D 9/00* (2013.01); *H01L 21/67092* (2013.01)

(58) Field of Classification Search
CPC ............... H01L 21/78; B23K 26/4075; B23K 26/0057; B28D 5/0011; B28D 1/221; B28D 5/022
USPC ........................... 438/460, 462–463, 113, 33; 257/E21.599, E21.238, 620, E21.596, 257/E21.602, 622
See application file for complete search history.

(56) References Cited

U.S. PATENT DOCUMENTS

| 4,049,944 | A | 9/1977 | Garvin et al. |
| 4,339,528 | A | 7/1982 | Goldman |
| 4,684,437 | A | 8/1987 | Donelon et al. |
| 5,336,638 | A | 8/1994 | Suzuki et al. |
| 5,593,606 | A | 1/1997 | Owen et al. |
| 5,691,794 | A | 11/1997 | Hoshi et al. |
| 6,051,503 | A | 4/2000 | Bhardwaj et al. |
| 6,057,180 | A | 5/2000 | Sun et al. |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — David Vu
*Assistant Examiner* — Jonathan Han
(74) *Attorney, Agent, or Firm* — Blakely Sokoloff Taylor Zafman LLP

(57) ABSTRACT

A method and system of hybrid dicing using a blade and laser are described. In one embodiment, a method involves focusing a laser beam inside the substrate in regions between the integrated circuits, inducing defects inside the substrate in the regions. The method also involves forming a groove on a surface of the substrate with a blade saw in the regions. The method further involves singulating the integrated circuits at the regions with the induced defects and the groove. In one embodiment, a system includes a laser module configured to focus a laser beam inside the substrate in regions between the integrated circuits, inducing defects inside the substrate in the regions. A blade grooving module is configured to form a groove in a surface of the substrate with a blade saw in the regions.

20 Claims, 10 Drawing Sheets

(56) References Cited

U.S. PATENT DOCUMENTS

| | | |
|---|---|---|
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,626,138 B2 * | 12/2009 | Bovatsek et al. ........ 219/121.69 |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,364,304 B2 * | 1/2013 | Starkston et al. ............ 700/166 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2006/0220183 A1 * | 10/2006 | Asai et al. ..................... 257/622 |
| 2007/0066044 A1 | 3/2007 | Abe et al. |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2014/0038392 A1 * | 2/2014 | Yonehara et al. ............. 438/463 |
| 2014/0145294 A1 * | 5/2014 | Moeller et al. ................ 257/499 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Yang, Kate, "The application of stealth dicing in the field of smart card", Chins Integrated Circuit (CIC), No. 3, 2013, pp. 54-56, http://cicmag.com.

"Stealth Dicing Technology and Applications", Technical Information Bulletin, Hamamatsu, Mar. 2005.

Chen, W. T. et al., "Processing TSV wafer with stealth dicing technology". IEEE Catalog No. CFP1259B-ART, pp. 271-273, 2012.

Kumagai, M., et al., "Advanced Dicing Technology for Semiconductor Wafer", IEEE Trans. Semi, Manuf., 20, pp. 259-265, 2007.

* cited by examiner

HYBRID DICING PROCESS USING A BLADE AND LASER

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is often required between the dies on the wafer to prevent damage to the integrated circuits. Such additional spacing can keep the chips and cracks at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of a typical saw is approximately 15 µm thick. As such, to insure that cracking and other damage surrounding the cut made by the saw does not harm the integrated circuits, three to five hundred µm often must separate the circuitry of each of the dies. Furthermore, after cutting, each die requires substantial cleaning to remove particles and other contaminants that result from the sawing process.

Another dicing technique is referred to as "stealth dicing." In stealth dicing, an infrared laser beam is focused inside a silicon substrate to generate defects or cracking. Then, the dies may be singulated by the application of tensile forces along the laser induced cracks. However, existing stealth dicing techniques may result in unwanted crack propagation, chipping, and delamination.

SUMMARY

Embodiments of the present invention are directed to hybrid dicing using a laser and a blade saw. In an embodiment, a method of dicing a substrate including a plurality of integrated circuits involves focusing a laser beam inside the substrate in regions between the integrated circuits, inducing defects inside the substrate in the regions. The method involves forming a groove on a surface of the substrate with a blade saw in the regions. The method further involves singulating the integrated circuits at the regions with the induced defects and the groove.

According to one embodiment, a method of dicing a semiconductor wafer including a plurality of integrated circuits involves focusing a laser beam inside the semiconductor wafer in regions between the integrated circuits, inducing defects inside the semiconductor wafer in the regions. The method involves forming a groove in a device layer of the semiconductor wafer with a blade saw. The method further involves singulating the integrated circuits at the regions with the induced defects and the groove.

In one embodiment, a system for dicing a substrate including a plurality of integrated circuits includes a laser module configured to focus a laser beam inside the substrate in regions between the integrated circuits, inducing defects inside the substrate in the regions. The system also includes a blade grooving module configured to form a groove in a surface of the substrate with a blade saw in the regions. The system further includes a tape extender configured to stretch tape over which the substrate is mounted, singulating the integrated circuits at the regions with the induced defects.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
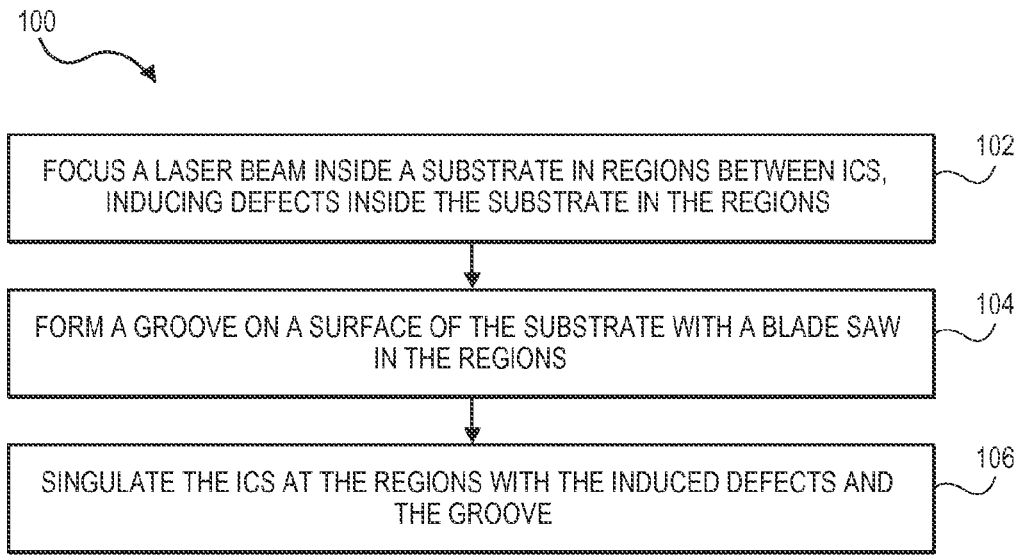
FIG. 1 is a flowchart representing operations in a method of hybrid dicing a substrate including a plurality of integrated circuits, in accordance with an embodiment of the present invention.

Methods of dicing semiconductor wafers, each wafer having a plurality of integrated circuits thereon, are described. In the following description, numerous specific details are set forth, such as exemplary grooving techniques, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid dicing process involves using a laser to induce defects inside the substrate and using a blade saw to groove the surface of the substrate. The die is then singulated (e.g., via expansion of dicing tape over which the substrate is mounted) along the regions with the laser-induced defects and grooves.

In existing stealth dicing methods, if there is a metal layer in the dicing street (e.g., such as alignment marks or test patterns), the laser used to perform the stealth dicing cannot penetrate through the metal layer to generate the desired defects or cracks. Even if the laser is able to generate defects or cracks, the clustered, non-uniform, or asymmetrical distribution of metal and/or dielectric layers can cause deviation of the crack propagation during tape expansion. Depending on the thickness, mechanical properties, and spatial distribution, the propagation of laser-induced internal defects may result in delamination of dielectric layers and peeling of metal layers. In one example, for a 0.1 μm wavelength infrared laser, the optical reflection at the air/silicon surface is about 30%. Therefore, there is very low linear optical absorption in the silicon, which favors focusing of the laser beam inside the silicon substrate. However, with the introduction of dielectric layers of the silicon substrate, the optical reflection at the interfaces (e.g., at an $SiO_2$/Si or SiN/Si interface) is lower, implying better coupling of the laser beam with the silicon substrate.

Moreover, because the dielectric layer distribution may be non-uniform in the dicing street, the coupling of the laser beam to the silicon substrate becomes nonuniform. Nonuniform coupling of the laser beam typically results in the creation of nonuniform defects or cracks (e.g., nonuniformities in terms of the size and depth of the defects). Deviation of crack propagation can be even more pronounced when there is a through silicon via (TSV) metal interconnection the dicing street. A TSV metal interconnect may act as a discontinuity point in a laser-induced embedded defect array, resulting in a higher likelihood of deviation. Thus, existing stealth dicing methods lack sufficient process control over the laser induced embedded crack propagation, leading to critical defects such as metal peeling and dielectric delamination.

In contrast, embodiments involve application of a laser to a back side of a semiconductor wafer to induce internal defects and grooving of the front side of the semiconductor wafer with a blade saw. The blade saw may be used to cleanly remove the device layers (including, e.g., organic and inorganic dielectric layers, and metal layers). As is described in more detail below, using a blade saw to form one or more grooves into the silicon substrate may result in improved guidance of the propagation of stealth dicing induced defects or cracks.

Turning to the figures, FIG. 1 illustrates operations in a method 100 of hybrid dicing a semiconductor wafer including a plurality of integrated circuits, in accordance with an embodiment of the present invention. In the embodiment of FIG. 1, the method 100 of dicing involves focusing a laser beam inside a substrate (e.g., below the surface of the substrate) in regions between integrated circuits (ICs), at operation 102. The internally-focused laser beam induces defects inside the substrate. The defects may include a crack in the region in which the laser is focused, or simply a phase change such as change of a crystalline silicon structure into an amorphous silicon structure, or a crystalline silicon structure to a liquid silicon phase. Because different phases of the same material will have different densities, a phase change is typically accompanied by a volume change in the laser-affected area. The neighboring areas that are unaffected by the laser constrain the laser-affected area and prevent or limit the volume change from occurring, which causes stress in the region of phase change. Laser induced defects may also include hole/pore formation. According to embodiments, the internal (e.g., embedded) defects have a width of less than or equal to 2 μm.

The substrate in which the defects are induced may include, for example, a semiconductor wafer of a material suitable to withstand a fabrication process and upon which processing layers may be disposed and/or patterned. For example, in one embodiment, a semiconductor wafer may be composed of a group IV-based material such as, but not limited to, crystalline silicon, germanium or silicon/germanium. In a specific embodiment, providing semiconductor wafer includes providing a monocrystalline silicon substrate. In a particular embodiment, the monocrystalline silicon substrate is doped with impurity atoms. In another embodiment, semiconductor wafer or substrate is composed of a III-V material such as, e.g., GaN used in the fabrication of light emitting diodes (LEDs). According to embodiments, the semiconductor wafer has a thickness approximately in the range of 100 μm to 800 μm. In other embodiments, the semiconductor wafer may be less than 100 μm (e.g., 50-60 μm).

Furthermore, embodiments may address dicing applications of IC wafers with an acceptable dicing kerf width approximately in the range of 50 µm to 200 µm, and more particularly approximately in the range of 50 µm to 100 µm measured on the wafer front surface. A range of 50-100 µm measured on the wafer front surface corresponds to a typical kerf width measured from the back side of the wafer of approximately 30-50 µm.

Figure 9:
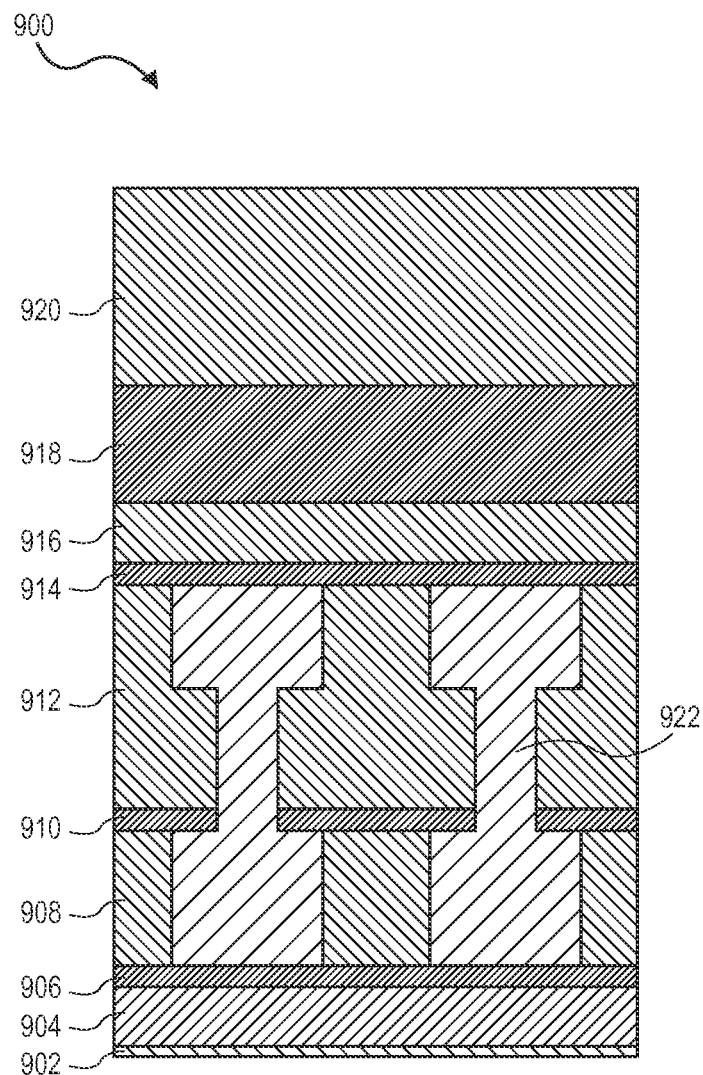
FIG. 9 illustrates a cross-sectional view of a stack of materials that may be present in a street region of a semiconductor wafer or substrate, in accordance with embodiments of the present invention.

The semiconductor wafer or substrate has disposed thereon or therein, as a portion of the integrated circuits, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps and passivation layers may be formed above the interconnect layers. Materials making up the dicing streets may be similar to or the same as those materials used to form the integrated circuits. For example, the streets may be composed of layers of dielectric materials, semiconductor materials, and/or metallization. In one embodiment, one or more of the streets includes test devices similar to the actual devices of the integrated circuits. FIG. 9 illustrates a cross-sectional view of a stack of materials that may be used in a street region of a semiconductor wafer or substrate, in accordance with an embodiment of the present invention. Referring to FIG. 9, a street region 900 includes the top portion 902 of a silicon substrate a first silicon dioxide layer 904, a first etch stop layer 906, a first low K dielectric layer 908 (e.g., having a dielectric constant of less than the dielectric constant of 4.0 for silicon dioxide), a second etch stop layer 910, a second low K dielectric layer 912, a third etch stop layer 914, an undoped silica glass (USG) layer 916, a second silicon dioxide layer 918, and a layer of photo-resist 920, with relative thicknesses depicted. Copper metallization 922 is disposed between the first and third etch stop layers 906 and 914 and through the second etch stop layer 910. In a specific embodiment, the first, second and third etch stop layers 906, 910, and 914 are composed of silicon nitride, while low K dielectric layers 908 and 912 are composed of a carbon-doped silicon oxide material.

According to embodiments, the laser beam has a relatively long pulse width, which enables greater thermal stress. The thermal stress from a laser beam having a long pulse width enables inducing defects or cracking with a greater amplitude or size. In one embodiment, the pulse width of the laser beam is greater than or equal to 10 picoseconds. Regarding the wavelength of the laser beam, silicon may transmit a greater percentage of a longer-wavelength laser beam than a shorter-wavelength laser beam. Thus, in one embodiment, the laser beam used to induce the defects inside the semiconductor wafer has a wavelength greater than 1,000 nanometers.

Although the laser-induced defects combined with tensile stress may be sufficient for die singulation along the regions with defects, delamination and chipping typically still occur, especially in embodiments with metal and/or dielectric layers. In contrast to existing methods, embodiments include forming a groove on a surface of the substrate with a blade saw. For example, returning to FIG. 1, the method 100 involves forming a groove on a surface of the substrate with a blade saw in the regions, at operation 104. As indicated above, the grooves may be formed before or after inducing the internal defects with a laser.

According to embodiments, forming grooves in the surface of the semiconductor wafer with the blade saw may involve removing a device layer in a dicing region. Removing the device layer in the dicing region may involve removing, e.g., metal and/or dielectric layer(s). The thickness of the blade saw may be selected to generate the desired width of the groove. Blade grooving may include a one-pass process at a constant speed. According to one embodiment, a blade saw is used to groove wafers when the dielectric materials are regular silicon oxide or nitride. In some embodiments, a mask is disposed over the semiconductor wafer. Such a mask may provide protection during one or more operations in the dicing process. For example, a mask may serve as a debris-collecting sacrificial layer that protects the underlying ICs during the dicing process. In an embodiment that involves mask formation over the semiconductor wafer prior to dicing, patterning with the blade saw may further involve forming a groove in the mask.

In one such embodiment, the groove(s) in the surface of the semiconductor wafer are approximately aligned with the induced defects in the regions between the integrated circuits. The groove(s) may be "solid line" grooves, or "dotted line" grooves, and in some embodiments, have widths in a range of 10-120 µm. The FIGS. 5A-5D, 6A-6D, 7A-7D, and 8A-8D, which are described in more detail below, illustrate a relatively wide groove 516. A wider groove may have the benefit of completely removing test features in the dicing street, while still guiding crack propagation during singulation. However, other types of grooves may be formed. For example, a sharp, narrow groove may be formed through the device layer and into the silicon substrate. According to embodiments, a sharp, narrow groove results in a higher stress concentration at the tip of the groove. During subsequent singulation (e.g., via tape expansion), the embedded crack tends to propagate to the groove tip, therefore resulting in the crack propagation along the die edges being well guided during singulation. In another embodiment, grooves on both sides of the induced defects may be formed. For example, grooves may be in the form of two parallel lines within the dicing street. The two adjacent grooves may then act as a "fire wall," confining propagation of the embedded crack between them.

Unlike some existing techniques that involve stealth dicing, embodiments involve removal of features in the dicing street such as test and/or alignment features with a blade saw. Although removal of such features may be desirable, removal of such features from the front side of the semiconductor wafer may make alignment of subsequent laser processing less accurate. Additionally, grooving with the blade saw may make the wafer susceptible to cracking during handling (e.g., during remounting or other processing). Thus, according to some embodiments, the blade grooving is performed after inducing the internal defects with a laser. However, other embodiments may involve blade grooving before inducing the internal defects with a laser.

Returning to FIG. 1, after inducing the defects with a laser at operation 102 and forming a groove with the blade saw at operation 104, the method 100 involves singulating the integrated circuits at the regions with the induced defects and grooves, at operation 106. Singulating the integrated circuits at the regions with the induced defects may involve, for example, expanding the tape over which the semiconductor wafer or substrate is mounted. Expanding the tape typically involves applying tensile stress to separate the dies. In other embodiments, other forms of singulation may be used, such as bending the semiconductor wafer along the regions with induced defects and grooves, or other suitable means of separating the ICs. According to embodiments, tape expansion (or other such methods of singulation) separates the integrated circuits along the laser-induced internal defects or cracks. The grooves help guide the crack propagation along the street and prevent unwanted defects and delamination. The singulated dies may then be subject to post-dicing processing and/or packaged.

Figure 2:
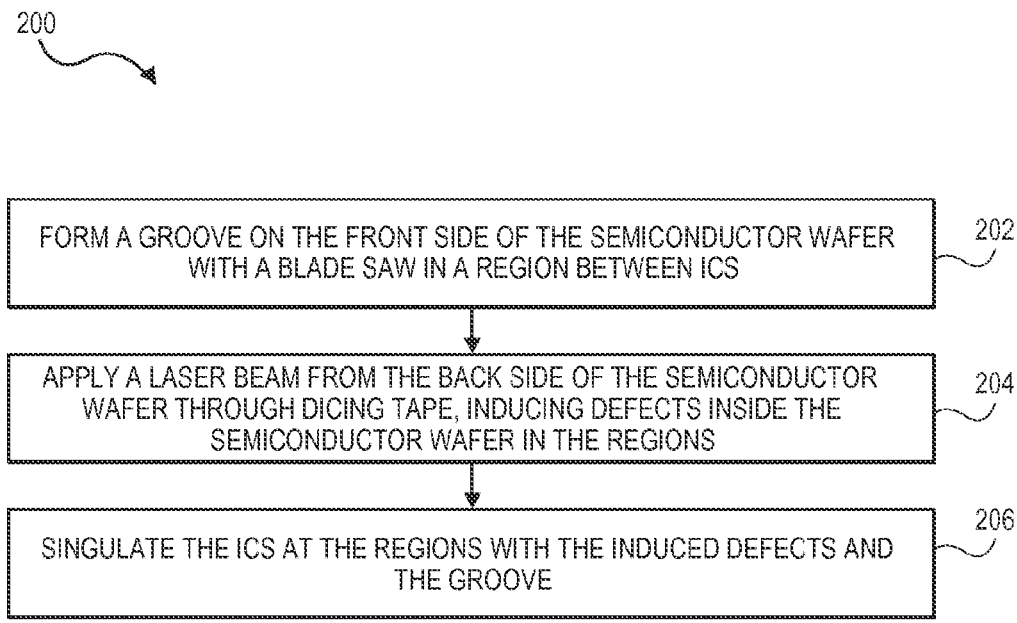
FIG. 2 is a flowchart representing operations in a method of hybrid dicing a semiconductor wafer including a plurality of integrated circuits, in accordance with an embodiment of the present invention.
Figure 3:
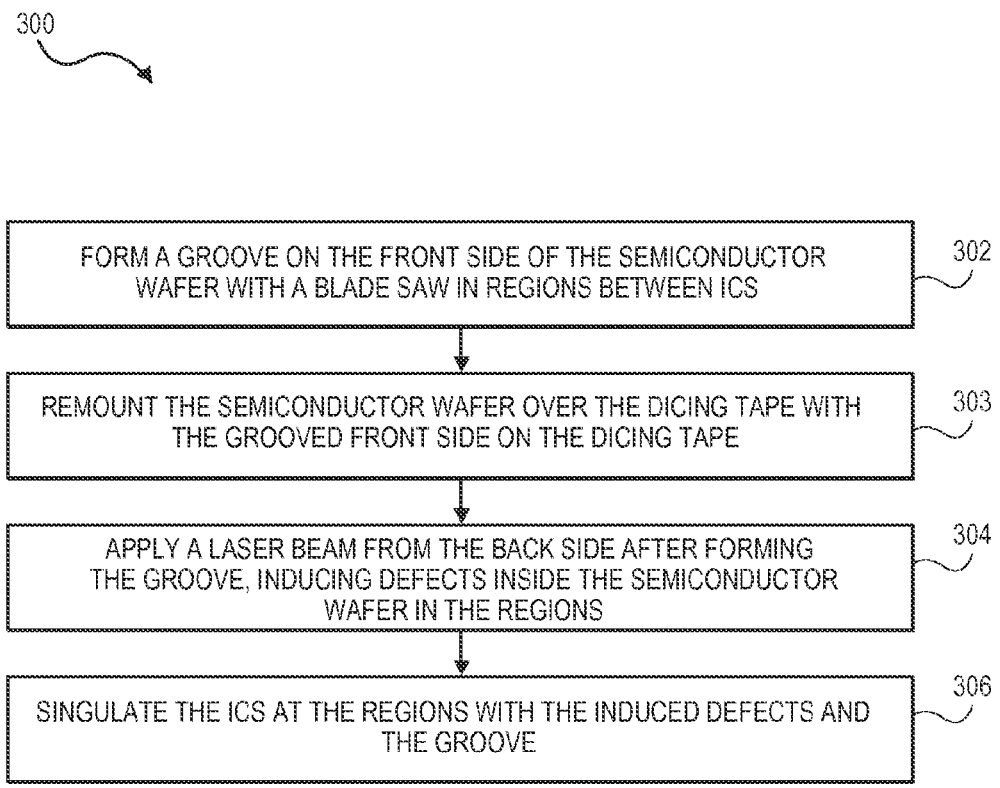
FIG. 3 is a flowchart representing operations in a method of hybrid dicing a semiconductor wafer including a plurality of integrated circuits, in accordance with an embodiment of the present invention.
Figure 4:
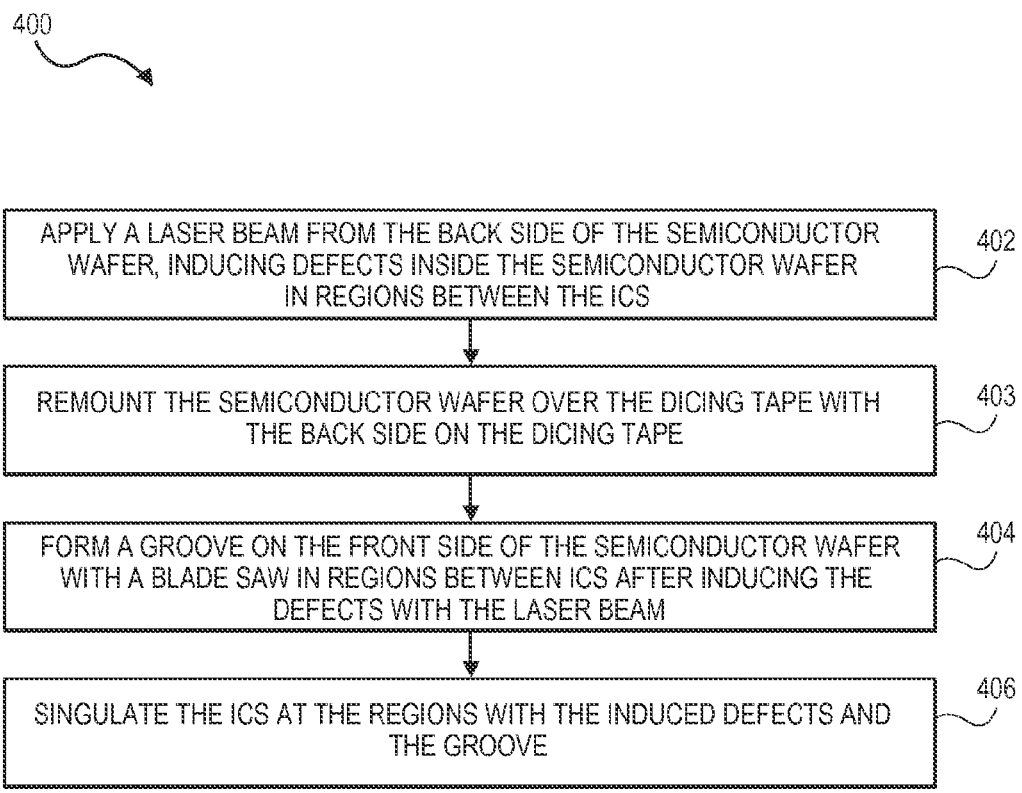
FIG. 4 is a flowchart representing operations in a method of hybrid dicing a semiconductor wafer including a plurality of integrated circuits, in accordance with an embodiment of the present invention.

FIGS. 2-4 illustrate specific embodiments of the method 100 of FIG. 1. FIGS. 2-4 and corresponding FIGS. 5A-5D, 6A-6D, 7A-7D, and 8A-8D illustrate embodiments where a semiconductor wafer (including a silicon substrate 502 and a device layer 506) is mounted over dicing tape 504 and supported by a frame 508. The frame 508 may include, for example, a support ring to which the dicing tape 504 may be attached, or other frame. Although the following examples include dicing tape attached to a frame, other support structures may be used to support the semiconductor wafer during dicing.

Figure 5A:
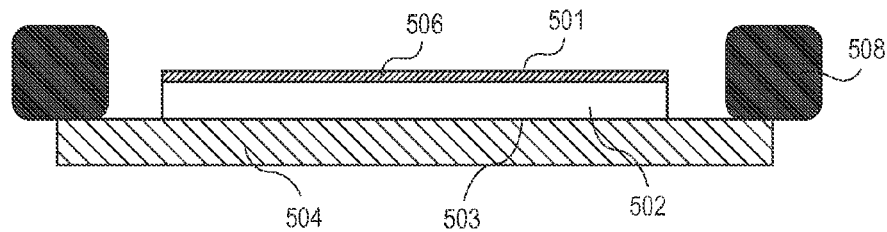
FIGS. 5A-5D illustrate cross-sectional views of a semiconductor wafer during performance of a method of hybrid dicing in which the semiconductor wafer is grooved with a blade saw prior to inducing internal defects with a laser, corresponding to FIG. 2, in accordance with embodiments of the present invention.
Figure 5B:
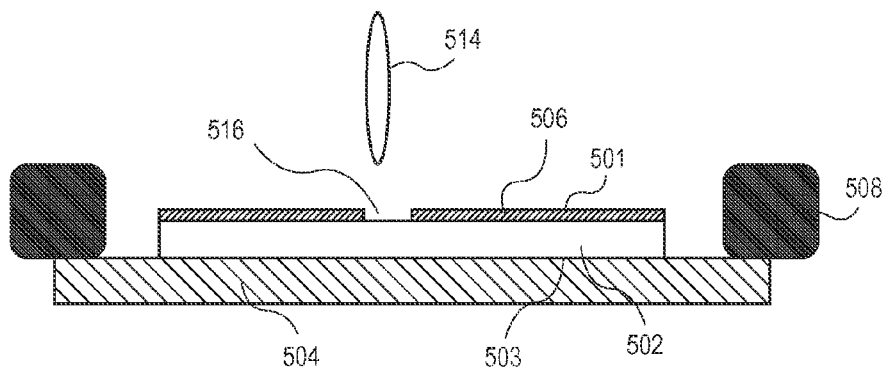
Figure 5C:
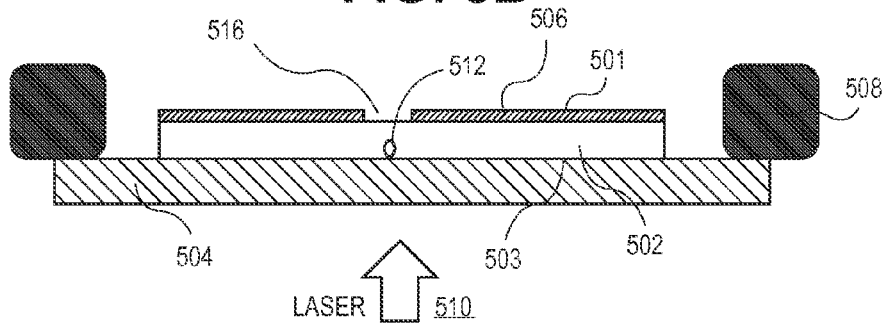

Turning first to FIG. 2 and to corresponding FIGS. 5A-5D, the method 200 involves forming a groove on the front side of the semiconductor wafer with a blade saw 514 in the regions, at operation 202. Thus, as illustrated in FIG. 5A, the semiconductor wafer is mounted with its back side 503 on the dicing tape 504. FIG. 5B illustrates formation of the groove 516 with the blade saw 514. Groove formation in operation 202 may be the same or similar to the groove formation of operation 104 of FIG. 1 described above. At operation 204 of FIG. 2 and corresponding to FIG. 5C, the method 200 involves applying a laser beam 510 from the back side 503 of the semiconductor wafer through the dicing tape 504, inducing defects 512 inside the semiconductor wafer in regions between the ICs. Thus, in one embodiment, the laser beam is introduced (e.g., applied) from the back side of the semiconductor wafer, which has a smoother surface in the dicing streets than the front side of the semiconductor wafer (e.g., the front side of the semiconductor wafer has a greater surface roughness in the dicing regions than the back side). The greater surface roughness on the front side of the semiconductor wafer may be due to, for example, features such as patterns for testing, alignment, etc. in the regions where the laser is focused (e.g., in the dicing street). According to one embodiment, the side of the semiconductor wafer through which the laser is introduced (e.g., the back side) has a surface roughness of less than or equal to 0.08 μm.

Figure 5D:
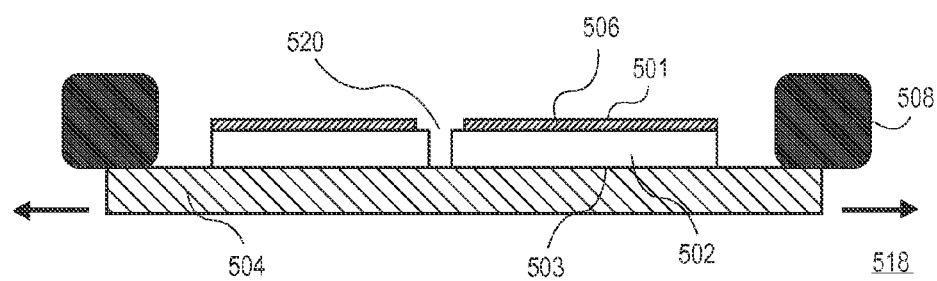

In an embodiment such as in FIG. 2 where the laser beam 510 is applied through the dicing tape 504 (or through another carrier or support), the dicing tape 504 is made from a material that is substantially transparent to the wavelength of the laser beam 510. After inducing the internal defects and forming the grooves, the ICs are singulated at the regions with the induced defects and the groove, at operation 206. FIG. 5D illustrates the application of tensile force (as illustrated by the arrows 518), resulting in singulation of the ICs (illustrated by the gap 520).

Figure 6A:
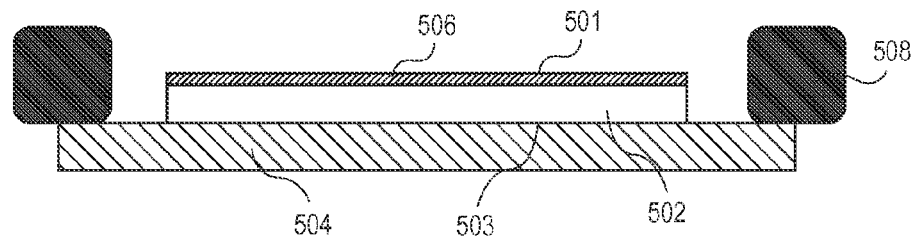
FIGS. 6A-6D illustrate cross-sectional views of a semiconductor wafer during performance of a method of hybrid dicing in which internal defects are induced with a laser prior to forming grooves with a blade saw, corresponding to FIG. 2, in accordance with embodiments of the present invention.
Figure 6B:
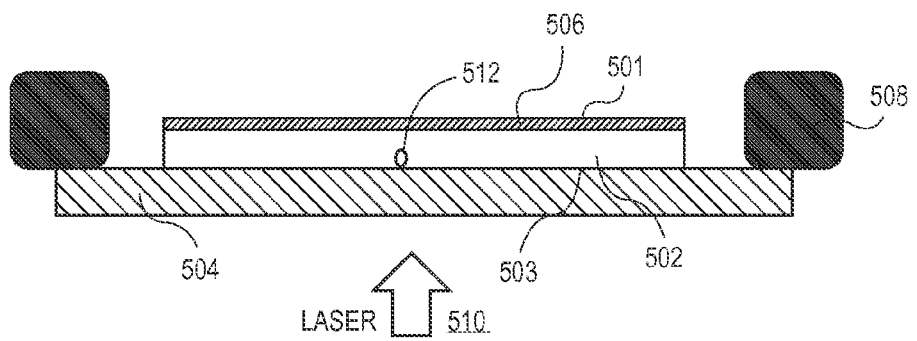
Figure 6C:
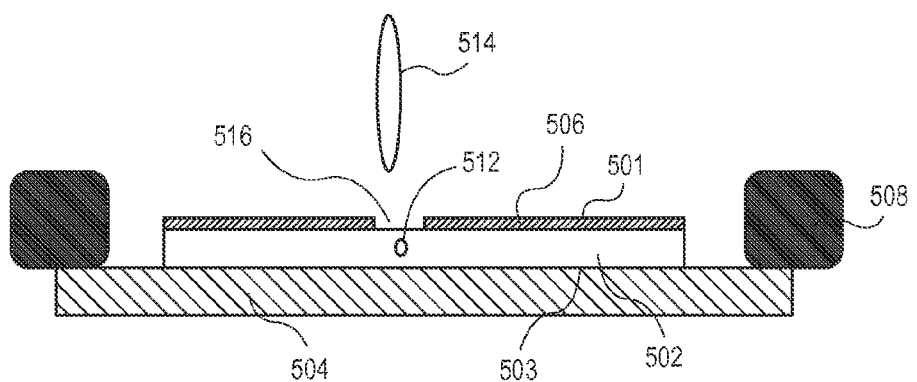
Figure 6D:
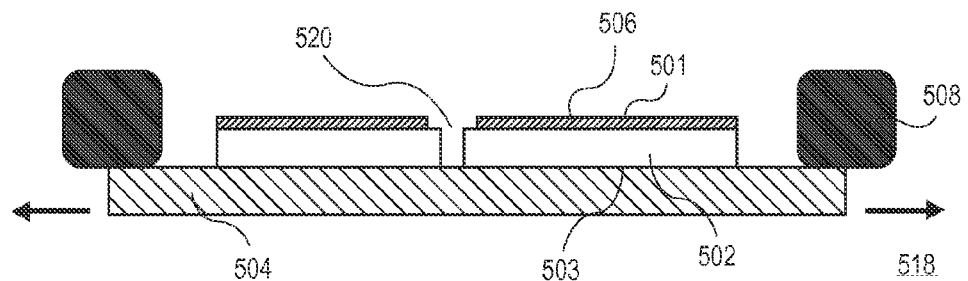

FIGS. 6A-6D also correspond to the method 200 of FIG. 2, but in contrast to FIGS. 5A-5D, illustrate an embodiment in which the defects inside the semiconductor wafer are induced before blade grooving. As illustrated in FIG. 6A, the semiconductor wafer is mounted with its back side 503 on the dicing tape 504. The method 200 may then involve application of the laser beam 510 from the back side through the dicing tape at operation 204, as illustrated in FIG. 6B. After inducing the internal defects with the laser 510, the method 200 may involve forming a groove on the front side with a blade saw 514, at operation 202, and as illustrated in FIG. 6C. FIG. 6D illustrates the subsequent application of tensile force (as illustrated by the arrows 518), resulting in singulation of the ICs (illustrated by the gap 520).

Figure 7A:
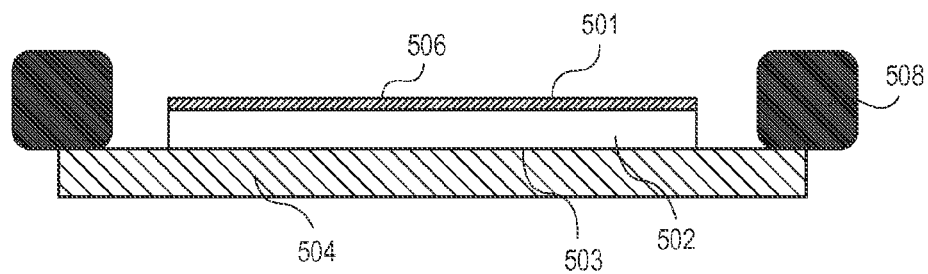
FIGS. 7A-7D illustrate cross-sectional views of a semiconductor wafer during performance of a method of hybrid dicing in which the semiconductor wafer is grooved with a blade saw prior to inducing internal defects with a laser, corresponding to FIG. 3, in accordance with embodiments of the present invention.
Figure 7B:
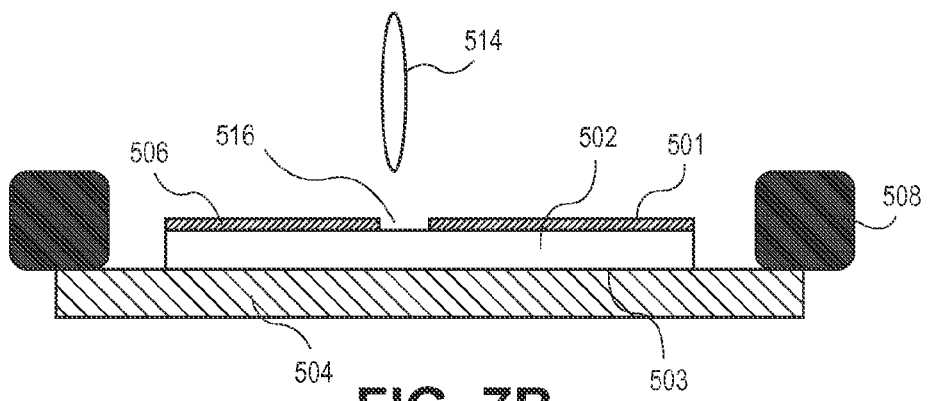
Figure 7C:
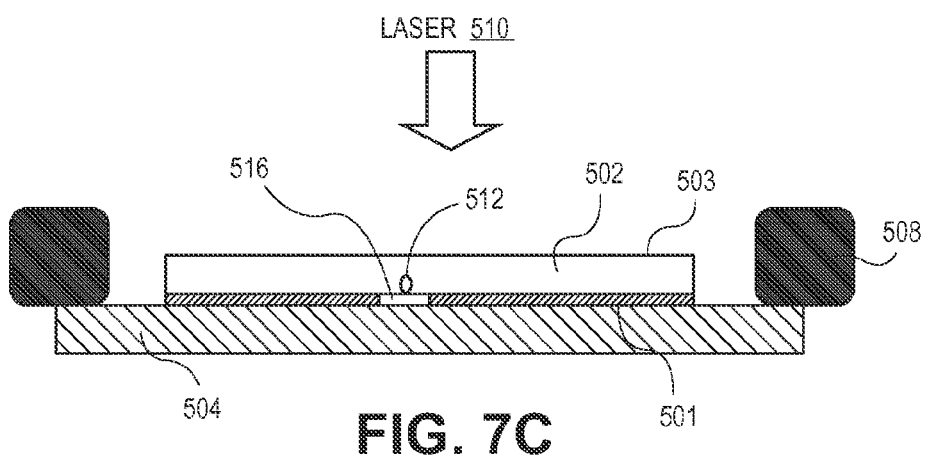
Figure 7D:
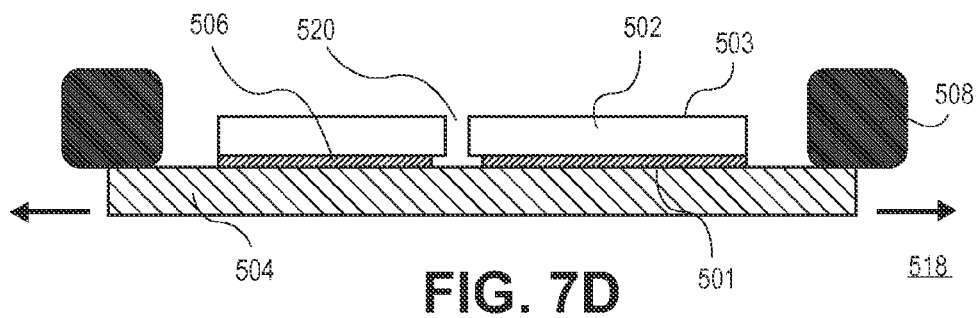

Turning to FIG. 3 and to corresponding FIGS. 7A-7D, the method 300 begins with a semiconductor wafer mounted with its back side 503 on dicing tape 504. At operation 302, and as illustrated in FIG. 7A, a groove 516 is formed on the front side 501 of the semiconductor wafer with a blade saw 514 in regions between ICs. At operation 303, and corresponding to FIG. 7C, the semiconductor wafer is remounted over the dicing tape with the grooved front side 503 on the dicing tape. At operation 304, which also corresponds to FIG. 7C, the laser beam 510 is applied from the back side after forming the groove 516, inducing defects inside the semiconductor wafer in the regions. FIG. 7D illustrates the subsequent application of tensile force (as illustrated by the arrows 518), resulting in singulation of the ICs (illustrated by the gap 520), at operation 306.

Figure 8A:
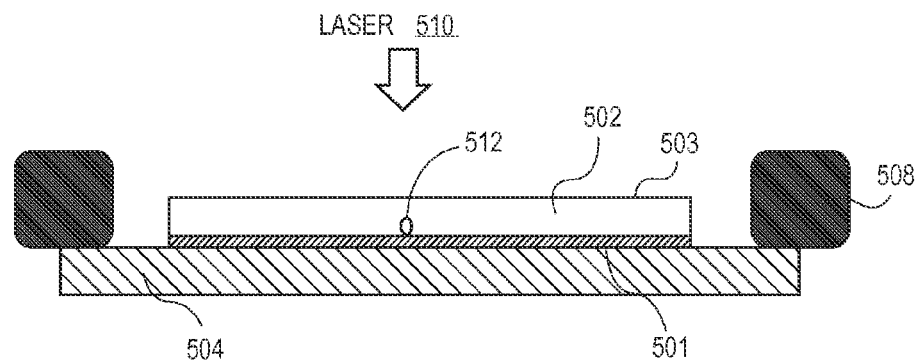
FIGS. 8A-8D illustrate cross-sectional views of a semiconductor wafer during performance of a method of hybrid dicing in which internal defects are induced with a laser prior to forming grooves with a blade saw, corresponding to FIG. 4, in accordance with embodiments of the present invention.
Figure 8B:
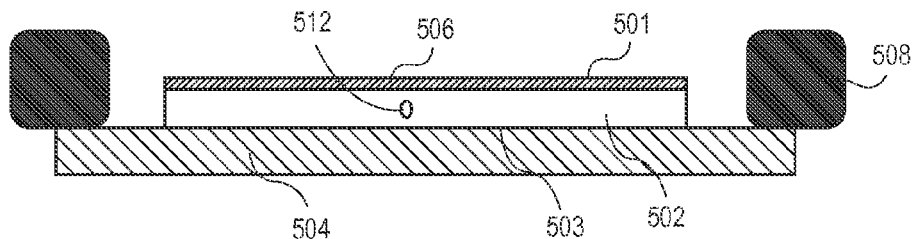
Figure 8C:
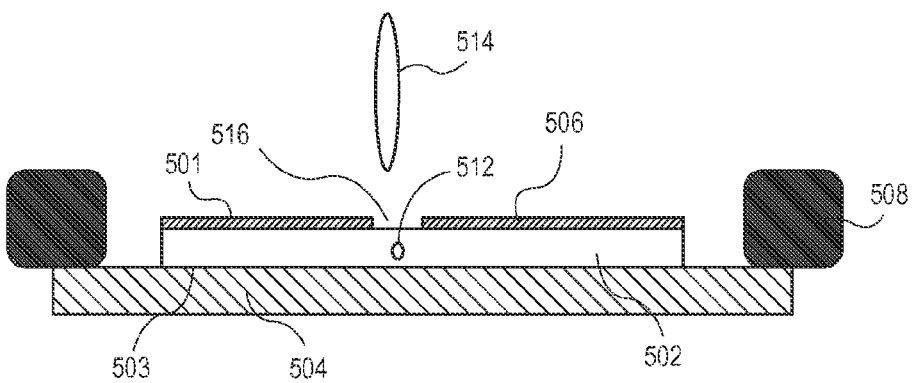
Figure 8D:
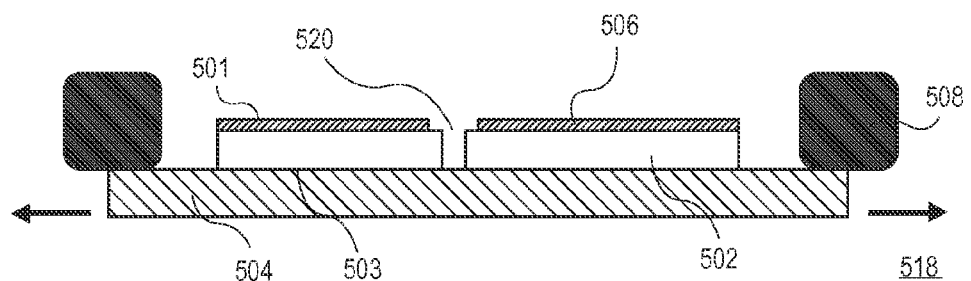

Turning to FIG. 4 and to corresponding FIGS. 8A-8D, the method 400 begins with a semiconductor wafer mounted with its front side 501 on dicing tape 504, as illustrated in FIG. 8A. At operation 402, the laser beam 510 is applied from the back side 501, inducing defects inside the semiconductor wafer in the regions between the ICs. At operation 403, the semiconductor wafer is remounted with its back side 503 on the dicing tape, as illustrated in FIG. 8B. A groove is then formed on the front side 501 of the semiconductor wafer with a blade saw 514 in the regions after inducing the defects with the laser beam 510, at operation 404 and as illustrated in FIG. 8C. FIG. 8D illustrates the subsequent application of tensile force (as illustrated by the arrows 518), resulting in singulation of the ICs (illustrated by the gap 520), at operation 406.

Figure 10:
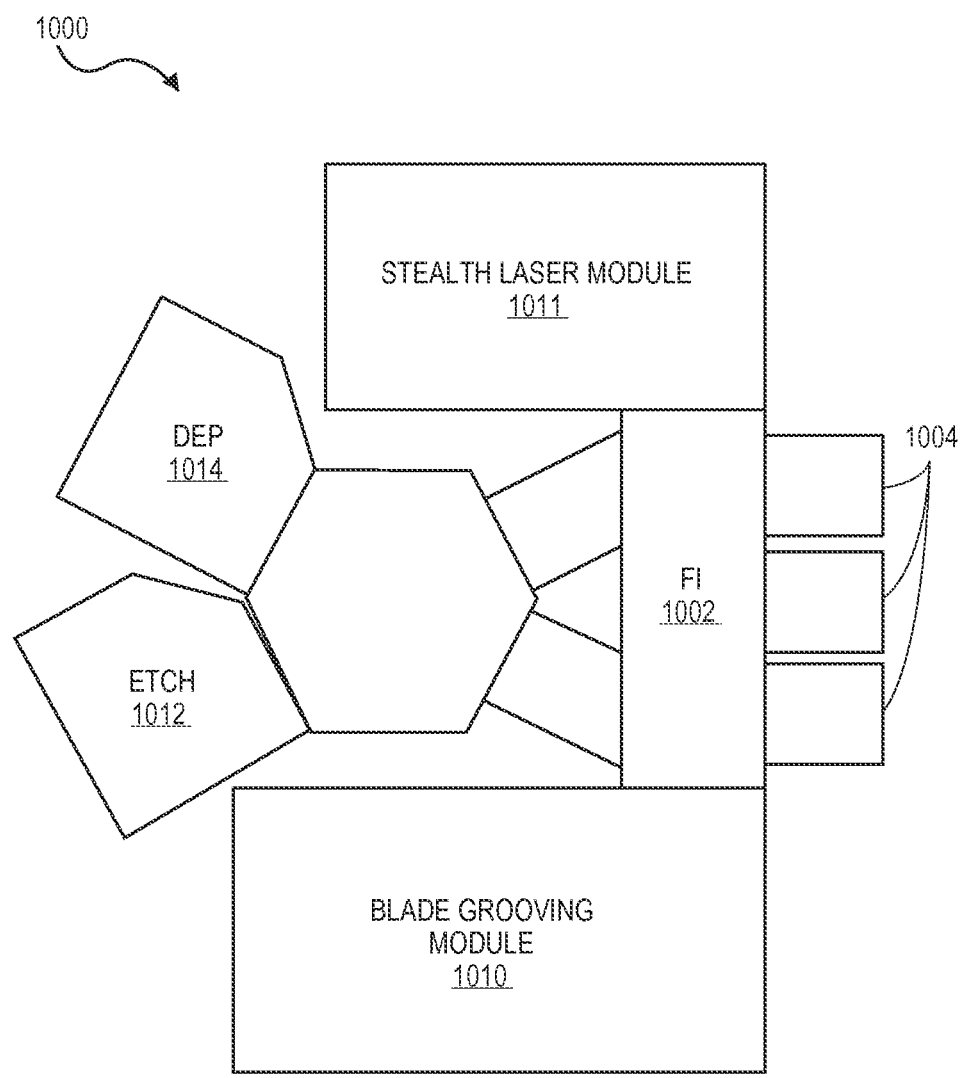
FIG. 10 illustrates a block diagram of a tool layout for hybrid dicing of wafers or substrates, in accordance with embodiments of the present invention.

A single process tool may be configured to perform many or all of the operations in a hybrid dicing process. For example, FIG. 10 illustrates a block diagram of a tool layout for hybrid dicing, in accordance with an embodiment of the present invention. Referring to FIG. 10, a process tool 1000 includes a factory interface 1002 (FI) having a plurality of load locks 1004 coupled therewith. A blade grooving module 1010 is coupled to the factory interface 1002. In an embodiment, the blade grooving module 1010 houses a blade saw. The blade saw is suitable for forming grooves such as in the hybrid dicing processes described above. In one embodiment, a moveable stage is also included in the blade grooving module 1010, the moveable stage configured for moving a wafer or substrate (or a carrier thereof) relative to the blade saw. In a specific embodiment, the blade saw is also moveable.

The process tool 1000 may also include a stealth laser module 1011. According to one embodiment, the stealth laser module 1011 is configured to focus a laser beam inside the substrate in regions between the integrated circuits, inducing defects inside the substrate in the regions. According to one embodiment, the stealth laser module 1011 may include a laser having a wavelength greater than 1000 nanometers and a laser pulse width greater than or equal to 10 picoseconds. In some embodiments, the process tool 1000 may also include one or more other process modules, such as a deposition module 1014 and etch module 1012. A deposition module may be used for forming a mask over the semiconductor wafer, and may include any appropriate type of deposition module (e.g., spin-coating, lamination, screen printing, etc.). The process tool 1000 may also include a tape extender (not shown) configured to stretch the tape over which the substrate is mounted, singulating the integrated circuits at the regions with the induced defects.

The factory interface 1002 may be a suitable atmospheric port to interface between an outside manufacturing facility with the laser modules 1010 and 1011, and other modules such as a deposition module 1014 and etch module 1012. The factory interface 1002 may include robots with arms or blades for transferring wafers (or carriers thereof) from storage units (such as front opening unified pods) into the modules of the process tool 1000.

Figure 11:
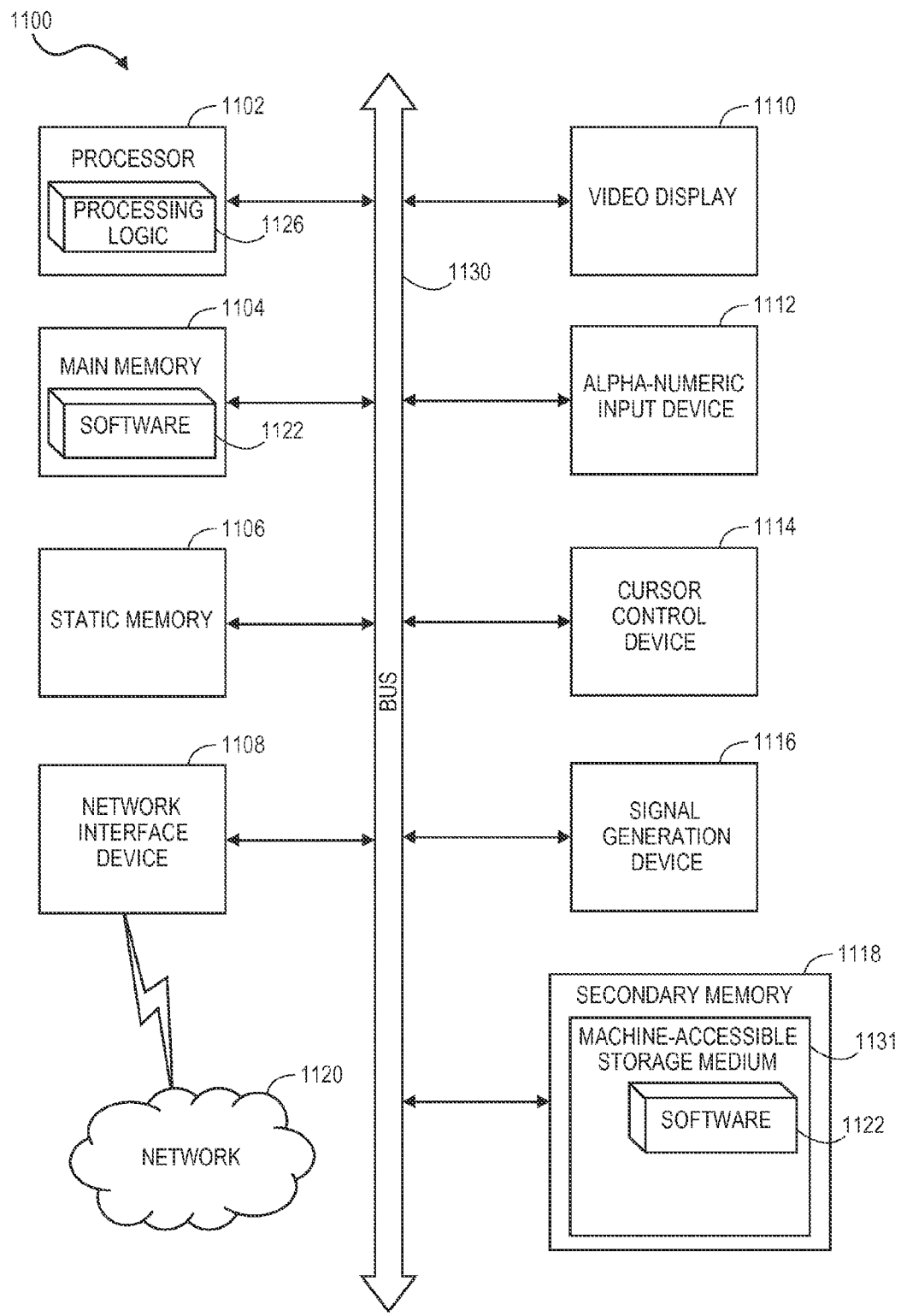
FIG. 11 illustrates a block diagram of an exemplary computer system which controls automated performance of one or more operations in the hybrid dicing method described herein, in accordance with an embodiment of the present invention.

FIG. 11 illustrates a computer system 1100 within which a set of instructions, for causing the machine to execute one or more of the dicing methods discussed herein may be executed. The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, etc. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations and steps discussed herein.

The computer system 1100 may further include a network interface device 1108. The computer system 1100 also may include a video display unit 1110 (e.g., a liquid crystal display (LCD) or a cathode ray tube (CRT)), an alpha-numeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1131 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1131 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

Thus, described herein are a method and system of hybrid dicing. Embodiments enable dicing of ICs with limited chipping and delamination, in contrast to existing stealth dicing methods. Additionally, embodiments may enable a physical-only dicing process (e.g., no plasma or chemical etching), and therefore eliminate masking requirements and post-processing requirements that may be associated with removal of post-etch chemical residue. It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a substrate comprising a plurality of integrated circuits, the method comprising:

focusing a laser beam inside the substrate in regions between the integrated circuits, inducing defects inside the substrate in the regions;

after focusing the laser beam inside the substrate in the regions between the integrated circuits, forming a groove on a surface of the substrate with a blade saw in the regions; and singulating the integrated circuits at the regions with the induced defects and the groove.

2. The method of claim 1, wherein:

focusing the laser beam inside the substrate comprises applying the laser beam from a back side of the substrate; and forming the groove comprises blade grooving a front side of the substrate;

wherein the front side of the substrate has a greater surface roughness in the regions than the back side of the substrate.

3. The method of claim 2, further comprising:

mounting the substrate over dicing tape with the back side on the dicing tape;

wherein focusing the laser beam inside the substrate comprises applying the laser beam from the back side of the substrate through the dicing tape.

4. The method of claim 2, further comprising:

mounting the substrate over dicing tape with the front side on the dicing tape;

wherein focusing the laser beam inside the substrate comprises applying the laser beam from the back side of the substrate.

5. The method of claim 4, further comprising:

remounting the substrate over the dicing tape with the back side on the dicing tape;

wherein forming the groove comprises blade grooving the front side of the substrate after remounting the substrate over the dicing tape and after inducing the defects with the laser beam.

6. The method of claim 2, wherein the substrate comprises a semiconductor wafer, and wherein the front side of the semiconductor wafer comprises a device layer.

7. The method of claim 6, wherein forming the groove further comprises:

forming a solid line groove in the surface of the substrate approximately aligned with the induced defects in the regions between the integrated circuits.

8. The method of claim 7, wherein forming the groove comprises forming a narrow groove in the surface of the substrate over the induced defects in the regions between the integrated circuits.

9. The method of claim 8, wherein forming the narrow groove comprises forming the narrow groove through a metal and/or dielectric layer and into a silicon substrate.

10. The method of claim 6, wherein forming the groove comprises forming a wide groove in the surface of the semiconductor wafer over the induced defects in the regions between the integrated circuits.

11. The method of claim 10, wherein forming the wide groove comprises forming the wide groove through a metal and/or dielectric layer and into a silicon substrate.

12. The method of claim 1, wherein forming the groove comprises:
forming grooves through a metal and/or dielectric layer and into a silicon substrate on both sides of the induced defects.

13. The method of claim 1, wherein singulating the integrated circuits at the regions with the induced defects comprises expanding tape over which the substrate is mounted.

14. The method of claim 1, wherein the laser beam focused inside the substrate comprises a laser having a wavelength greater than 1000 nanometers and a laser pulse width greater than or equal to 10 picoseconds.

15. The method of claim 1, wherein forming the groove comprises removing a test feature in the regions.

16. The method of claim 1, wherein forming the groove comprises forming the groove having a width in a range of 10-120 μm.

17. A method of dicing a semiconductor wafer comprising a plurality of integrated circuits, the method comprising:
focusing a laser beam inside the semiconductor wafer in regions between the integrated circuits, inducing defects inside the semiconductor wafer in the regions;
after focusing the laser beam inside the semiconductor wafer in the regions between the integrated circuits, forming a groove in a device layer of the semiconductor wafer with a blade saw; and
singulating the integrated circuits at the regions with the induced defects and the groove.

18. The method of claim 17, wherein:
focusing the laser beam inside the semiconductor wafer comprises applying the laser beam from a back side of the semiconductor wafer; and
forming the groove comprises blade grooving a front side of the semiconductor wafer;
wherein the front side of the semiconductor wafer has a greater surface roughness in the regions than the back side of the semiconductor wafer.

19. A system for dicing a substrate comprising a plurality of integrated circuits, the system comprising:
a laser module configured to focus a laser beam inside the substrate in regions between the integrated circuits, inducing defects inside the substrate in the regions;
a blade grooving module configured to form a groove in a surface of the substrate with a blade saw in the regions after induction of the defects inside the substrate in the regions with the laser module; and
a tape extender configured to stretch tape over which the substrate is mounted, singulating the integrated circuits at the regions with the induced defects.

20. The system of claim 19, wherein the laser module comprises a laser having a wavelength greater than 1000 nanometers and a laser pulse width greater than or equal to 10 picoseconds.

* * * * *